United States Patent [19]

Yoshida

[11] Patent Number: 4,792,270

[45] Date of Patent: Dec. 20, 1988

[54] AUTOMATIC RENTAL SAFE-DEPOSITING BOX SYSTEM

[75] Inventor: Kakuo Yoshida, Osaka, Japan

[73] Assignee: Itoki Co., Ltd., Osaka, Japan

[21] Appl. No.: 879,527

[22] Filed: Jun. 23, 1986

Related U.S. Application Data

[63] Continuation of Ser. No. 589,417, Mar. 14, 1984, abandoned.

[30] Foreign Application Priority Data

Mar. 16, 1983 [JP] Japan ................... 56-42316
Apr. 11, 1983 [JP] Japan ................... 58-53674

[51] Int. Cl.⁴ ............................................. B65G 65/00
[52] U.S. Cl. ..................................... 414/273; 186/37;
235/383; 364/478; 414/277; 414/281; 414/285;
414/21
[58] Field of Search ............... 414/273, 277, 281, 285,
414/21; 186/37, 55, 56; 109/1 R, 21, 38;
104/39; 198/950; 364/478; 235/379, 381, 382,
383; 901/49

[56] References Cited

U.S. PATENT DOCUMENTS

| | | | |
|---|---|---|---|
| 3,220,572 | 11/1965 | Curtis | 414/285 |
| 3,526,326 | 9/1970 | Castaldi | 414/273 |
| 3,964,577 | 6/1976 | Bengtsson | 414/281 X |
| 4,225,278 | 9/1980 | Weiner | 414/281 X |
| 4,580,941 | 4/1986 | Inaba et al. | 901/49 X |

FOREIGN PATENT DOCUMENTS

| | | | |
|---|---|---|---|
| 1128326 | 4/1962 | Fed. Rep. of Germany | 109/21 |
| 2254840 | 7/1975 | France | 109/21 R |
| 209101 | 12/1982 | Japan . | |
| 209383 | 12/1982 | Japan . | |

Primary Examiner—Robert J. Spar
Assistant Examiner—Stuart J. Millman
Attorney, Agent, or Firm—Hopgood, Calimafde, Kalil, Blaustein & Judlowe

[57] ABSTRACT

A system wherein a contractor of a rental safe-deposit box can privately obtain, handle and restore his own box in the fire-proof safe room. The system includes an automatic article retrieval and storage unit located within the safe room and having contractors' safe-deposit boxes. A plurality of private compartments for contractors' use are disposed separately from the safe room and are connected to the retrieval and storage unit by conveyor devices extending through a safe room wall opening having a fire-proof door. Each private room includes a user's data input terminal device and a handling table. A reception data input terminal is provided at a reception counter. When a contractor visits the reception counter, a reception serial number card is issued to him. The reception serial number and his box code are inputted by the reception input terminal. Thereafter, the contractor inputs his own private code and the issued reception serial number in a private compartment. When the set of his own private code inputted from the user's input terminal and the box code inputted from reception input terminal conincides wih any one of combinations of private codes and box codes registered in the system, his own rental safe-deposit box is automatically extracted onto the handling table from the safe room.

Various indicators are disposed at a remote section from the private compartments for indicating undesired conditions which happen in each private compartment.

5 Claims, 4 Drawing Sheets

AUTOMATIC RENTAL SAFE-DEPOSITING BOX SYSTEM

BACKGROUND OF THE INVENTION

This application is a continuation, of application Ser. No. 589,417, filed Mar. 14, 1984, now abandoned.

1. Field of the Invention

This invention relates to rental safe-deposit box systems and, in particular, to automatic rental safe-deposit box systems wherein a safe-deposit box of a hirer or a contractor of the system can be automatically retrieved to a private compartment from a safe room in response to a retrieving request by the contractor in the box, and the retrieved compartment is also automatically returned into the safe room in response to a returning request by the contractor.

2. Description of the Prior Art

In copending U.S. patent application ser. No. 563,806 filed on Dec. 21, 1983 which was assigned to the same assignee, such an automatic rental safe-deposit box system is proposed.

The automatic rental safe-deposit box system as proposed in the copending application comprises an automatic box retrieval and storage unit constructed in said safe room, the unit comprising box storing shelf means having a plurality of box storage locations arranged in a matrix-like form, a box delivery and return station provided at an end of the shelf means, a transporting platform means being disposed to be movable along a front surface of the shelf means for transporting a box between the box delivery and return stations and a selected one of the box storage locations, a box delivery means being mounted on the platform means for effecting the delivery between the platform means and the article box storage location selected, and between the platform means and the delivery and return stations; An opening is formed in a fire-proof wall defining the safe room for permitting boxes to pass therethrough. A plurality of private compartments are disposed separtely from the safe room, each for permitting each user to privately handle his own rental box therein. Data input terminal means is disposed within each compartment and permits a user to input information data required for retrieving his own rental box and to input a storage command after his use of the rental box. Transporting means comprise a single main transporting means extending from the box delivery and return station to vicinities of the plurality of private compartments through the wall opening, and a plurality of sub-transporting means connecting the single main transporting means and respective private compartments. The transporting means are for transporting a rental box between the box delivery and return stations and a selected one of the plurality of private compartments. Box displacing means are provided at cross positions between the single main transporting means and respective sub-transporting means, and displace a box on the single main transporting means to one of the sub-transporting means corresponding to the selected one of the private compartments. Electric control means is connected to the data input terminal means and controls operations of the automatic box retrieval and storage unit, the transporting means and the box displacing means, whereby a user can automatically obtain, and again store, his own rental box only by operating the data input terminal within one of the private compartments.

In the system of the copending application, since a hirer or a contractor can perform retrieval and return of his rental box without handling and observation by others, there is an advantage for a bank that a person or clerk is not necessary for reception of contractors visiting the bank. However, if there is no receptionist or no information clerk, it results in permission of any unconcerned person accessing the private compartment, which is undesirable.

Furthermore, since the rental-box retrieval operation of the system is initiated after a contractor of the rental box enters a private compartment and after he operates the data input terminal, it takes a relatively long time until he can access his own rental box. A long waiting time is disadvantageous for the contractor.

In order to return the retrieved rental box, the contractor must operate the data input terminal to input a return command. If the contractor unfortunately forgets to input the return command and leaves the private room, his rental box is not returned into the safety room but is left in the private room. This is an important problem for the rental safe-deposit box system.

Further, since the return operation of the retrieved box is also performed automatically without handling by any person, there is a problem that the transporting means and/or the automatic box retrieval and storage unit would be destroyed due to return of a box having an excess weight.

Moreover, there is a problem that a key left to fit in a lock of a rental box is also stored in the safe room together with the box.

SUMMARY OF THE INVENTION

It is an object of this invention to provide an automatic rental safe-deposit box system wherein a receptionist is required as an operator.

It is another object of this invention to provide such a system wherein a time period during which a contractor awaits his own box in a private compartment is comparatively short.

It is still another object of this invention to provide such a system wherein it is indicated for a bank clerk or an operator of the system that a contractor leaves a compartment without returning his box.

It is yet another object of this invention to provide such a system wherein an excessive weight of a rental box is detected and indicated for an operator of the system and the return operation of the system is prohibited.

It is a further object of this invention to provide such a system wherein a return of a rental box with a key is detected and indicated for an operator of the system and the return operation of the system is prohibited.

It is another object of this invention to provide such a system wherein it is indicated for an operator of the system that a retrieved rental box is brought out of the private room.

It is still another object of this invention to provide such a system wherein it is indicated for an operator of the system that the retrieved box is not correctly placed on the handling table for return operation.

According to this invention, an automatic rental safe-deposit box system is obtained for automatically retrieving a rental safedeposit box belonging to a user as requested by the user from a safe room storing a lot of boxes belonging to respective users.

An automatic box retrieval and storage unit is constructed in the safe room. The unit comprises box storing shelf means having a plurality of box storage locations arranged in a matrix-like form, a box delivery and return station provided at an end of the shelf means, a transporting platform means being disposed to be movable along a front surface of the shelf means and transporting a box between the box delivery and return stations and a selected one of the box storage locations, and a box delivering means being mounted on the platform means for effecting box delivery between the platform means and a selected one of the article box storage locations and between the platform means and the delivery and return stations. An opening is formed in a fire-proof wall defining the safe room for permitting boxes to pass therethrough. A plurality of private compartments are disposed separately from the safe room, each for permitting each user to privately handle his own rental box therein. Transporting means are provided for transporting a rental box between the box delivery and return stations and a selected one of the plurality of private compartments through the opening. Data input terminal means comprises a reception data input terminal means being disposed at a remote place from the private compartments for inputting a reception serial number and a box code of a desired box, and a user's data input terminal means being disposed in each one of the plurality of private compartments for inputting the reception serial number, a box retrieval command and a box storage command. Electric control means is connected to the data input terminal means for controlling operations of the automatic box retrieval and storage unit and the transporting means.

The electric control means has a comparing means for comparing the reception serial number from the reception data input terminal means and the reception serial number from the user's data input terminal means, and the electric control means starts a control operation for retrieving a box corresponding to the box code inputted at the reception data input terminal means in response to a coincidence signal from the comparing means.

In one aspect of this invention, the user's data input terminal means has means for inputting a private code assigned to each user. The comparing means is connected to first memory means for storing combinations of private codes assigned to respective users and box codes of the corresponding users. A set of the private code inputted together with the reception serial number from the user's data input terminal means and the box code inputted together with the same reception serial number from the reception data input terminal means is compared with the combinations stored in the first memory means, and the comparing means outputs a start signal for the retrieval control operation.

In another aspect of this invention, the system has second memory means for temporarily storing the data inputted at the reception data input terminal means. The stored data of the second memory means are read out into the comparing means for comparison.

In still another aspect of this invention, when the electric control means receives a data set of the reception serial number and the box code from the reception data input terminal means, the electric control means transfers the data set to the second memory means while controlling the platform means to be positioned at a box storage location corresponding to the inputted box code.

According to yet another aspects of this invention, indicators for indicating various undesired conditions which happen in the private compartments are provided at a place remote from the compartments.

Further objects, features and other aspects of this invention will be understood from the following detailed descriptions of preferred embodiments of this invention referring to the accompanying drawings.

DETAILED DESCRIPTION OF PREFERRED EMBODIMENTS

Figure 1:
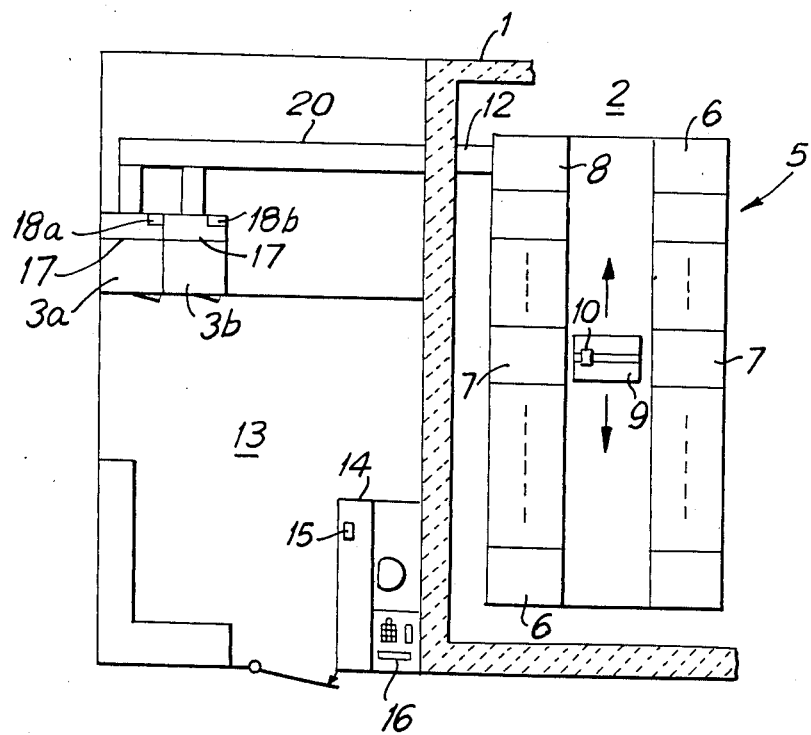
FIG. 1 is a plan view schematically illustrating a layout of an embodiment of this invention.
Figure 2:
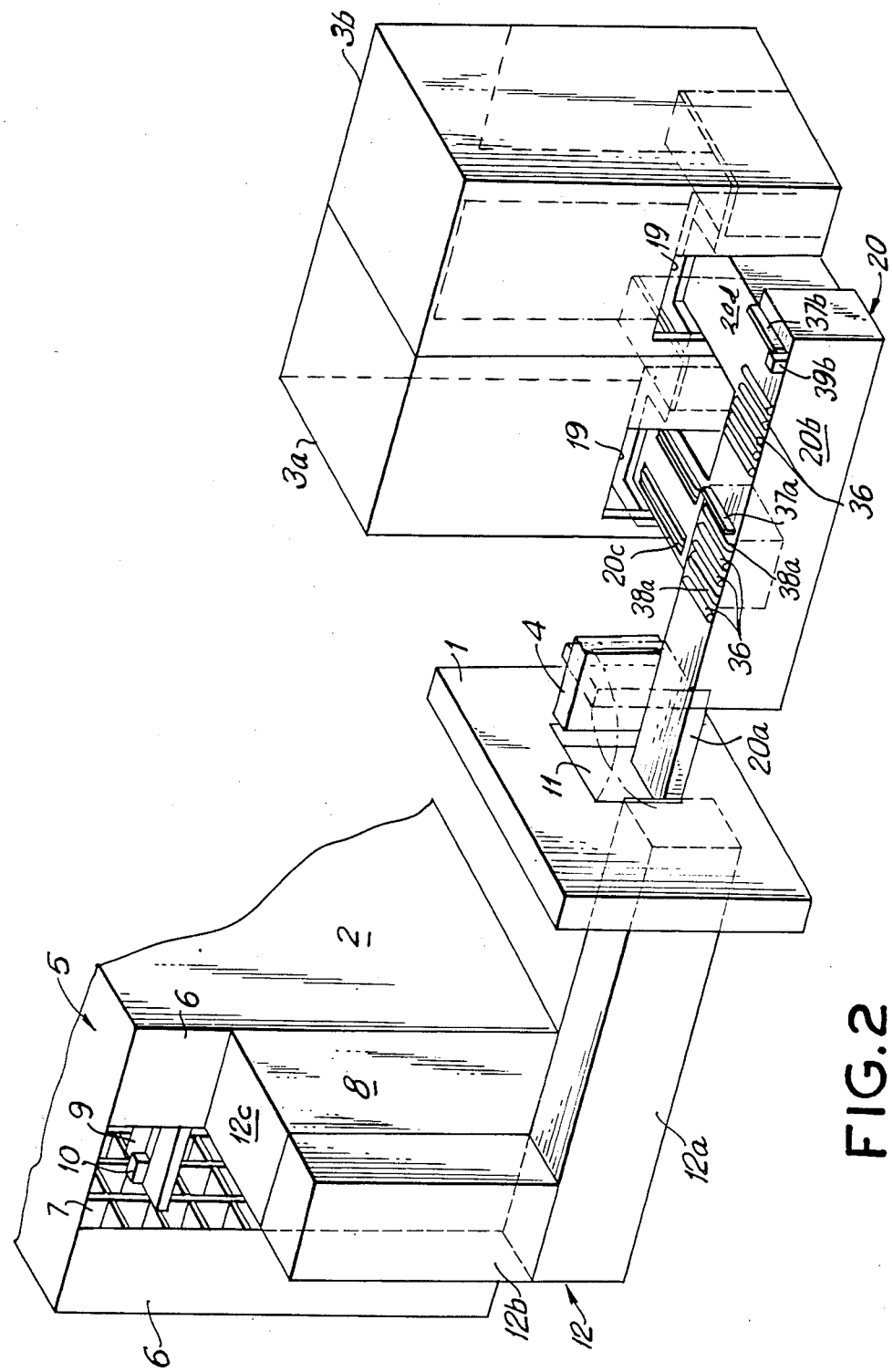
FIG. 2 is a rear perspective view schematically illustrating the embodiment.

Referring to FIGS. 1 and 2, the system shown therein comprises a safe room 2 for storing rental safe-deposit boxes (as shown at 46 in FIG. 4) therein and being enclosed by a wall 1 (only a portion thereof is shown) such as a fire-proof or refractory wall, and a plurality of private compartments or rooms (two rooms 3a and 3b are shown) for clients' or hirers' privately handling their own safe-deposit boxes and being located apart from safe room 2. The safe room 2 is provided with a fire-proof door 4 in the wall 1 for permitting the safe-deposit boxes to pass therethrough.

Within safe room 2, an automatic box storage and retrieval unit 5 for storing the safe-deposit boxes at predetermined locations in a shelf or a rack is established wherein a desired one of the stored boxes can be automatically taken out of the unit and automatically returned to the predetermined location in the shelf. Well-known automatic object storage and retrieval apparatus, as described in U.S. Pat. No. 3,526,326 and others, are conventionally used for such an automatic box storage and retrieval unit. Namely, this unit is provided with storage shelves 6 (confronting two shelves are shown) each of which has a plurality of box storing locations 7 arranged into a matrix-like form, a transportation platform 9 which conveys a box between each storing location 7 and a delivery and return station 8 provided at one end of the confronting storage shelves, a box gripping or engaging means 10 used for transferring a box between transportation platform 9 and a storing location 7 or delivery and return station 8, and a control circuit (not shown in the drawings).

When the control circuit receives a code indicating a storing location of a box to be retrieved and a take-out or retrieval command, transportation platform 9 moves and reaches the inputted box storing location, and box gripping means 10 is actuated to take out the storage box or the rental safe-deposit box onto transportation platform 9. Then, platform 9 moves to delivery and return station 8, where gripping means 10 is again actuated to transfer the box to the station 8.

For return and storage operation, a code indicating the storing location of the box to be returned and a return command are inputted to the control circuit. Then, transportation platform 9 moves to delivery and return station 8, and gripping means 10 transfers the box onto transportation platform 9, which, in turn, moves to the storing location inputted. Then, gripping means 10 is actuated to transfer the box onto the corresponding storing location.

The detailed construction and the functions of the automatic box storage and retrieval unit are well-known in the prior art, and therefore, are not described further.

In safe room 2, there is a transporting device 12 connecting the safe room entrance 11 closed by door 4 with delivery and return station 8. In the embodiment shown, the transporting device 12 comprises a horizontal conveyor 12a, an elevator 12b vertically connecting the delivery and return station 8 with one end of horizontal conveyor 12a, and another conveyor 12c feeding a box into elevator 12b from delivery and return station 8.

A waiting room 13 is located adjacent safe room 2 and separated from safe room 2 by fire-proof wall 1. Private rooms 3a and 3b are located adjacent waiting room 13 and are connected to waiting room 13 through respective doorways. In waiting room 13, a reception counter 14 is disposed adjacent a doorway of the waiting room 13.

A plurality of serial number cards 15 are provided at reception counter 14, and are issued to contractors visiting the reception counter 14. Each card 15 has a printed number and a magnetic recording medium in which a code corresponding to the serial number printed on the card.

Reception counter 14 is also provided with a reception data terminal 16 which is for inputting a serial number of reception card 15 issued to a visitor received and a number or data of a rental safe-deposit box of the visitor.

Each private room of 3a and 3b is provided with a handling table 17, and an operating console 18 (which is shown at 18a and 18b corresponding to respective private rooms 3a and 3b) which has a magnetic card reader for reading out the serial number code recorded on the card 15, a ten-key board for inputting a contractor's recitation or private code, keys for inputting retrieval or storage commands, and displays. The back wall of each private room of 13a and 13b is provided with a box passing gate 19. A transporting device 20 extends through gate 19 to connect safe room entrance 11 with handling table 17. The transporting device 20 comprises a movable conveyor 20a which is away from entrance 11 when door 4 is closed and approaches it so as to be connected with inside conveyor 12a when door 4 is opened, and a main conveyor 20b connected with movable conveyor 20a, and sub-conveyors 20c and 20d which are branched from the main conveyor 20b and extended to handling tables 17 of respective rooms 3a and 3b through respective gates 19. The movable conveyor 20a is shown in the embodiment as a swing-up type conveyor, which is pivoted to be rotatable up and down at one end of the main conveyor 20b and driven by a motor (not shown).

Figure 3:
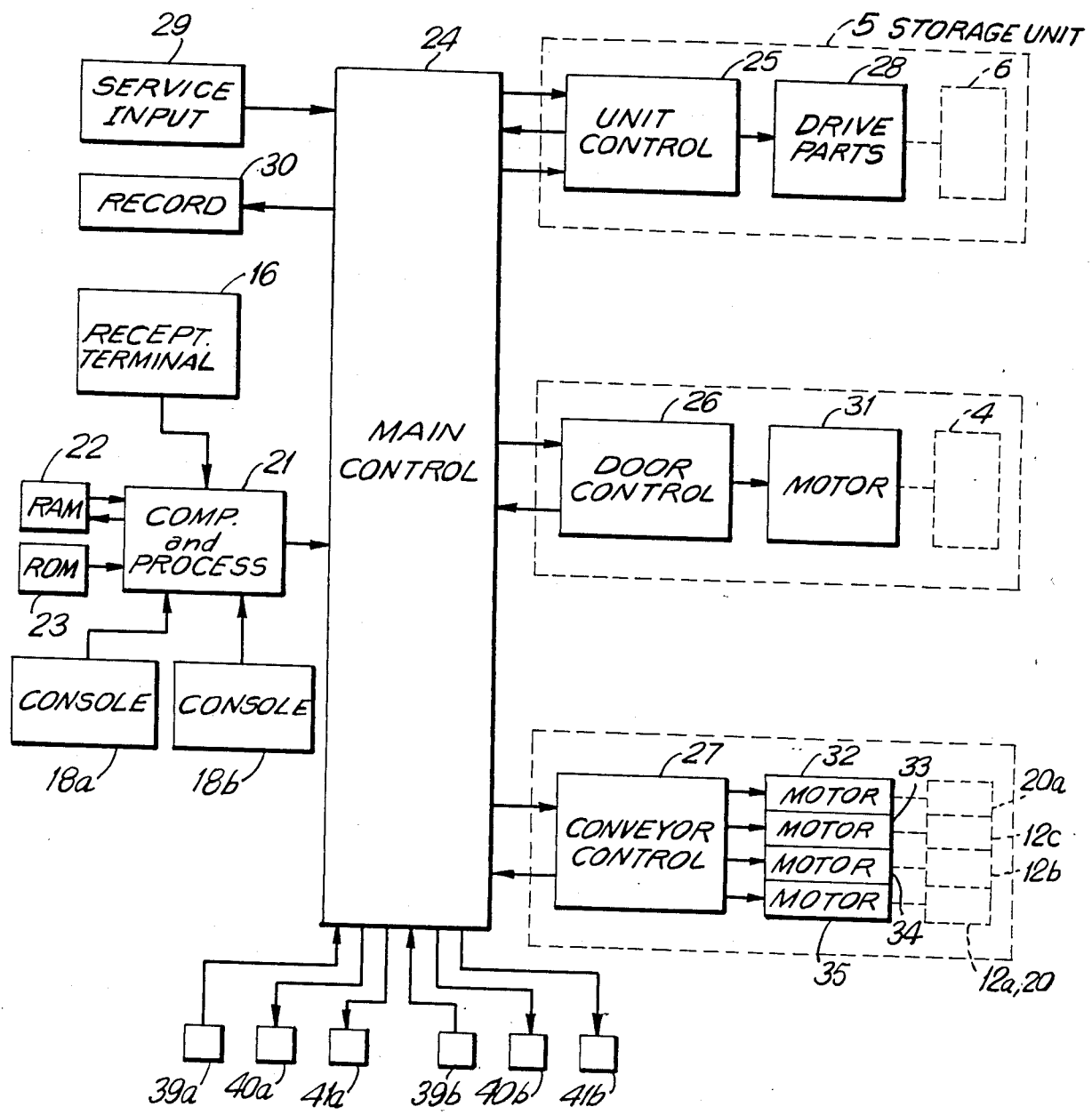
FIG. 3 is a view illustrating a block diagram of a control circuit in the embodiment.

Now referring to FIG. 3, a control circuit of the system will be described. In the figure, reception data terminal 16 and consoles 18a and 18b of respective private rooms 13a and 13b are connected to a comparing and processing circuit 21, to which a first memory unit 22 and a second memory unit 23 are connected.

First memory unit 22 is a random access memory (RAM) for temporarily storing a plurality of sets of the serial number of reception card 15 and the box number which are sequentially inputted at reception data terminal 16.

Second memory unit 23 is a read only memory (ROM) which records private numbers and box numbers assigned to respective contractors.

The comparing and processing circuit 21 receives the sets of the serial number of reception card 15 and the box number from reception data terminal 16 and transfer the data to RAM 22 so as to store the data therein, and the box number to a main control circuit 24. While, when the comparing and processing circuit 21 receives information including the serial number of serial number card 15 and the contractor's private number from any one of consoles 18a and 18b, comparing and processing circuit 21 reads out a set of the box number and the serial number, and then compares a set of the private number from the console and the read-out box number with the content of ROM 23. When the data set is located in the content of ROM 23, comparing and processing circuit 21 provides to a main control circuit 24 the read-out box number and a private room identification signal for representing the private room corresponding to the console from which the comparing and processing circuit 21 has just received the set of the serial number and the contractor's private number.

Main control circuit 24 generates control signals to control operations of storage and retrieval unit 5, door 4, and transporting devices 12 and 20 in response to information inputted from comparing and processing circuit 21. Moreover, a control circuit 25 of storage and retrieval unit 5, a control circuit 26 of door 4, and a control circuit 27 of transporting devices 12 and 20 are connected to main control circuit 24.

When receiving the box number from comparing and processing circuit 21, main control circuit 24 transfers the box number to control circuit 25 of storage and retrieval unit 5, which, in turn, generates a control signal to driving parts 28 so as to position platform (9 in FIG. 1) to a storing location 7 of a storage shelf corresponding to the box number. Thereafter, main control circuit 24 receives the private room identification signal from data comparing and processing circuit 21, and then provide a retrieval command signal to control circuit 25 of the unit 5. Then, the control circuit 25 provides control signals to driving parts 28 so that extraction of the box onto the platform 9 by gripping means 10, movement of the platform 9 to delivery and return station 8 and transportation of the box from platform 9 onto delivery and return station 8 are sequentially performed.

On the other hand, when receiving the private room identification signal, main control circuit 24 provides a control signal to a control circuit 27 of transporting devices 12 and 20 to operate the transporting devices 12 and 20 so as to transfer the box from delivery and return station 8 to the private room indicated by the private room identification signal.

Door 4 is generally opened at a time when the bank having the system opens, and is closed at a time when the bank service is closed.

The system has a service input device 29 and a recording device 30 in a portion of the reception data input terminal 16 or in a form of a different data input terminal which is disposed at a proper location such as a business administration center. The service input device 29 and the recording device 30 are connected to main control circuit 24. The service input device 29 commands input or placement of the box numbers and the reception numbers into ROM 23, and controls establishment of the initial state and stop of the system at start and termination of daily service, respectively. The recording device 30 records service data of the system such as the service date (year, month, day and hour), retrieval storage history of the boxes, and the like.

For starting the safe-box service, predetermined items such as date, hour, operator code and the recognition code assigned to the operator are inputted via the service input device 29. This information is sent to main control circuit 24 and is compared with the contents in ROM 23. If there is no discrepancy with the contents in ROM 23, main control circuit 24 sends command signals for setting control circuits 25, 26 and 27 into their initial states, respectively.

When receiving the initial state setting signal, the control circuit 25 of the automatic storage and retrieval unit 5 controls respective driving parts (as represented by 28) of the transportation platform 9 and the gripping means 10 in such a way that they can be moved to their predetermined initial positions, respectively, and then sends a termination signal of the initial state setting to main control circuit 24.

On the other hand, the door control circuit 26 actuates a driving motor 31 to open door 4 in response to the initial state setting signal. After opening door 4, the door control circuit 26 sends a door-open signal to main control circuit 24.

When receiving the door-open signal, main control device 24 sends a signal (a connecting signal) for commanding movement of movable conveyor 20a to entrance 11, as the initial state setting signal, to the control circuit 27 of the transporting device. Accordingly, motor 32 is driven and movable conveyor 20a moves to entrance 11, whereby the inside and outside conveyors 12a and 20b are connected to one another through the movable conveyor 20a. When this operation is completion, a complete signal is sent from the conveyor control circuit 27 to main control device 24.

When receiving both the completion signal and the abovementioned signal from the unit control circuit 25, main control device 24 activates an indicator on service input device 29 to display completion of the initial state setting, and at the same time, activates recording device 30 to record the inputted data in a predetermined format. Thus, the system is put in the waiting condition for a requirement of safe-deposit box retrieval.

After starting the service, a hierer or a contractor, who visits to use his box, shows his ID card or communicates his box number to the clerk at reception counter 14. The clerk inputs the box number and the reception serial number to reception data input terminal 16 and then issues a reception card 15 of the serial number to the contractor.

As described above, the data inputted at the terminal 16 is stored in RAM 22 through data comparing and processing circuit 21 while the box number is transferred to main control device 24 so that platform 9 is positioned to a box storing position 7 of the box number.

The contractor having the issued reception serial number card 15 enters a vacant one of the private rooms 3a and 3b. For example, in private room 3a, the user inserts the card 15 into the card reading device on console 18a, and inputs his private number by the keyboard checking the indicator on console 18a. The data inputted at console 18a is applied to data comparing and processing circuit 21, which processes the input data and the stored data in RAM 22 and ROM 23, as described above. When a combination of the private number inputted at console 18a and the box number read out from RAM 22 is located in the contents in ROM 23, a private room identification signal is provided to main control device 24 for representing the private room 3a, as described above. However, when the combination is not located out in the contents of ROM 23, data comparing and processing circuit 21 provides a signal to reception data input terminal 16 so as to display an invalid access at an indicator for a long time and stops the operation of the system from proceeding.

When main control device 24 receives the private-room identification signal, it provides the retrieval command signal to control circuit 25 of the unit 5.

Upon receiving the retrieval command signal, the unit control circuit 25 controls the respective driving parts 28 of transportation platform 9 and gripping means 10 in such a way that the take-out operation of the required box onto delivery and return station 8 is performed, after which a take-out complete signal is sent to main control device 24.

The main control device 24, then, generates a command signal to conveyor control circuit 27 to begin transport operation. The control circuit 27 starts and controls operation of the transporting devices 12 and 20, namely, puts the driving motor 33 of conveyor 12c on delivery and return station 8 in motion to feed the box to the elevator 12b, makes elevator 12b descend by a driving motor 34 so as to place the box on the horizontal conveyor 12a, puts the respective driving motors (represented as 35) of horizontal conveyor 12a, movable conveyor 20a, main conveyor 20b, and sub-conveyors 20c in motion to feed the box onto handling table 17 in the private room 3a. When these operations are completed, a transport complete signal is sent to main control device 24 from the control circuit 27.

The main control device 24, then, commands the retrieval operations of a box requested from a different private room 3b, or storage operation (described later) thereof, if there is such a request.

In the system, as there are multiple private rooms (two in this embodiment), a stopper plate that moves up and down, an object detecting means, and object displacing means are located at each of the crossing points between the main conveyor 20b and the respective sub-conveyors 20c and 20d, so that the object can be displaced on a sub-conveyor corresponding to a requesting private room. Namely, each crossing point is provided with a stopper plate e.g., 37a, 37b, which is moved upwardly through a space between adjacent conveyor rollers 36 of main conveyor part 20b in order to stop transportation of the object moving in the direction of the main conveyor 20b, and a belt conveyor e.g., 38a which runs in a direction perpendicular to the main conveyor 20b and is elevated from below over the conveyor roller surface, as shown at the crossing point between main conveyor 20b and sub-conveyor 20c in FIG. 2, and further provided with a detector (for example, a microswitch, a photoelectric switch, etc.) for detecting the presence of the object thereon, e.g. detector 39b shown at the crossing point between the main conveyor 20b and the sub-conveyor 20d. The components 36, 38 and 39 located at the crossing point with the sub-conveyor 20c corresponding to the private room 3a are designated with suffix "a", while those to the private room 3b with suffix "b".

The up and down motion of stopper plate 37a, 37b, and the up and down motion and transport operation of the belt conveyor 38a, 38b are carried out under control of main control device 24. The output of the detector 39a, 39b is also connected with main control device 24 and used for controlling belt conveyor 38a, 38b. Namely, referring to FIG. 3, if a box retrieval is demanded from private room 3a, in addition to the retrieval operation as mentioned above, a driving motor 40a for stopper plate 37a at the crossing point between subconveyor 20c corresponding to the private room 3a and main conveyor part 20b is driven to elevate the stopper plate 37a. Thereafter, when there is a detection output of detector 39a, (not shown in FIG. 2) an up and down motion motor and a driving motor for transportation of belt conveyor 38a (both are represented as 41a in FIG. 3) are activated by main control device 24 to elevate the belt conveyor 38a and start the transporting action. Thereby, the box located at the crossing point is displaced from main conveyor 20b to sub-conveyor 20c and sent out on handling table 17 in the requesting private room 3a through sub-conveyor part 20c.

When the transporting action is finished, the motors 40a and 41a are driven in reverse to lower stopper plate 37a and the belt conveyor 38a.

When the box retrieval is requested from another private room 3b, another stopper plate 37b and another belt conveyor (not shown) at the crossing point with sub-conveyor 20d are driven similarly. These driving motors are shown at 40b and 41b in FIG. 3.

For returning the box retrieved at, for example, private room 3a, the storage command key on console 18a is operated, and the ten key board on console 18a is also operated for inputting the box number.

In a certain system designation, a set of the reception serial number and the box number is stored in RAM 22 until the box is returned. In such a case, the reception serial number card 15 is again loaded into the magnetic card reading device on the console 18a.

Data comparing and processing circuit 21 receives the storage command signal from console 18a, and then provides to main control device 24 the private-room identification signal for representing the private room 3a together with the storage command signal and the box number as received or read out from RAM 22.

Main control device 24 applies the storage command signal and the private-room identification signal to conveyor control unit 27 to start the return operation. Namely, the conveyor control circuit 27 actuates elevator driving motor 34 to lower elevator 12b, and also rotates the respective driving motors 35 of sub-conveyor 20c, main conveyor 20b, the movable conveyor 20a, and horizontal conveyor 12a in order to feed the box from the handling table 17 onto the descended elevator 12b. Then, elevator driving motor 34 is driven to elevate elevator 12b. When the elevator 12b arrives at delivery and return station 8, driving motor 33 of conveyor 12c is driven to take out the box from the inside of elevator 12b and place it on the station 8. The conveyor control circuit 27 then sends a completion signal to main control device 24, which transmits the box number and the storage command signal to the unit control circuit 25. Then, the control circuit 25 actuates driving motors 28, etc. to start the storage action of transportation platform 9 and gripping means 10, so that the box on the delivery and return station 8 can be returned to the storing location on the shelf designated by the box number. When the return action is completed, unit control circuit 25 sends a signal to main control device 24, whereby the system is in a condition awaiting a new request from a private room, or starts the operation already requested from a private room.

At the end of a day's service, the person in charge inputs the information necessary to stop the service operation of the system from the service input device 29 in the similar manner as in the service start. If there is no abnormality in the information inputted, main control device 24 sends a recovery signal to conveyor control circuit 27, which thereupon rotates motor 32 reversely to turn movable conveyor 20a upwards. When the upward motion of the conveyor 20a is completed, a conveyor motion complete signal is sent to main control device 24, which, in turn, sends a door closing signal to door control circuit 26 to drive motor 31 reversely in order to close door 4. When door 4 is closed, a door closed signal is sent to main control device 24 and the system stops.

Figure 4:
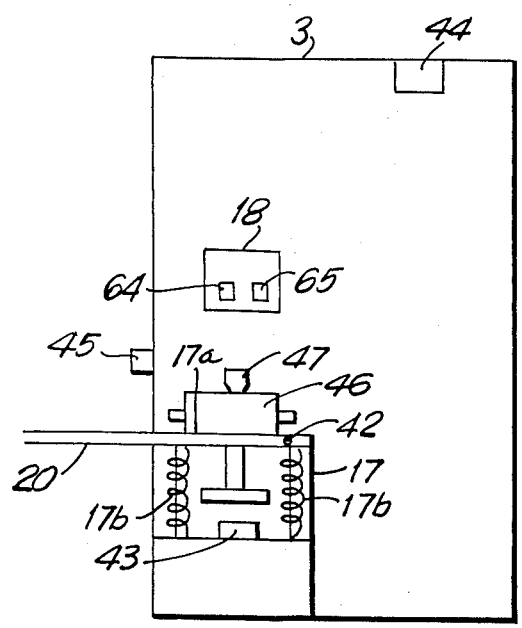
FIG. 4 is a view illustrating a private compartment used in the system.

Referring to FIG. 4, another embodiment of the private room 3 is also provided with various sensors 42-45 in addition to the box handling table 17 and the console 18.

A sensor 42 for sensing a box 46 on box handling table 17, for example, a microswitch, a photosensor or the like, is mounted on handling table 17.

Another sensor 43 is provided for sensing an excessive weight of the box 46. A top plate 17a of handling table 17 is supported by springs 17b so as to be moved downwardly at a time when the box is placed on the top plate 17a. The weight sensor 43 is, for example, a microswitch, a photosensor or the like, and is disposed at a level beneath top plate 17a so as to sense the descent of the top plate to a predetermined vertical lower level. Thus, weight sensor 43 can detect whether the weight of the box 46 is unacceptably excessive or not.

Another sensor 44 which is for detecting a person being in the private room is disposed in the private room 3. As the sensor 44, a visible or infrared light source and a photodetector are used and are disposed on confronting sidewalls of the room 3, or confronting ceiling and floor, respectively. The light emitted from the light source is broken by a person entering the room 3 thereby to detect the person being in the room 3.

In addition to the sensor 44, any door closing sensor can be used. A microswitch or a reed switch is mounted on a door frame or a door at the doorway of the room 3.

Another sensor 45 is disposed at gate 19 of the room 3 for sensing a key 47 which is left to be fitted in a lock of the box 46. A microswitch or other sensing unit is used as the key sensor 45 and is fixedly disposed to sense key 47 which passes together with box 46 through gate 19.

Figure 5:
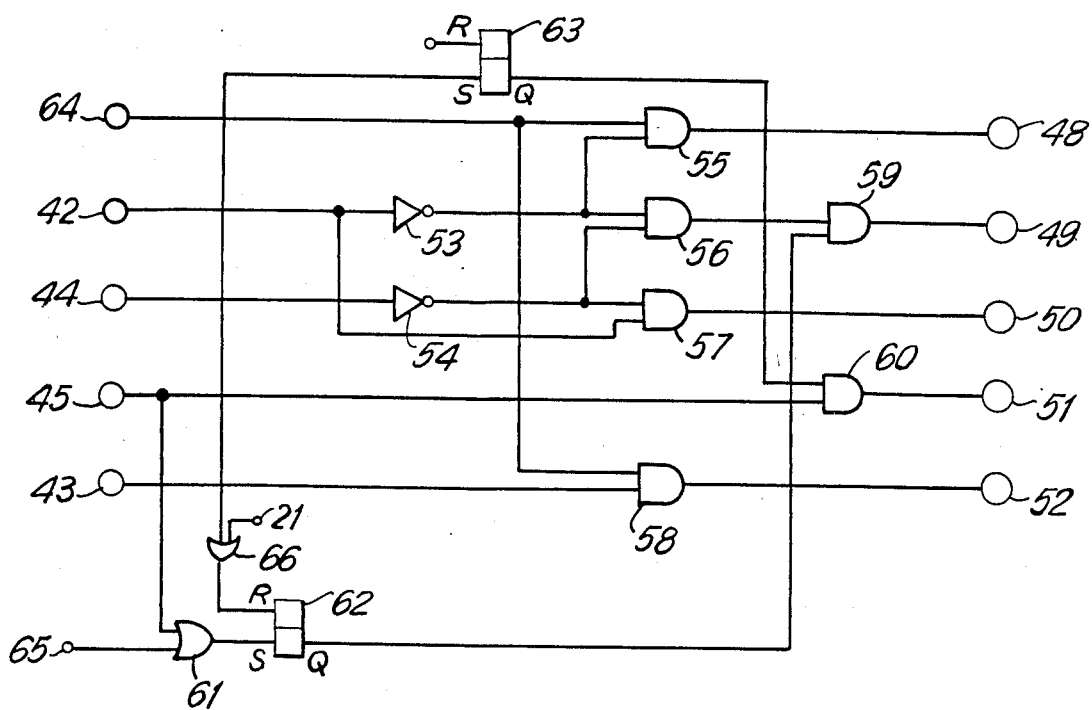
FIG. 5 is a view of a circuit diagram for actuating various indicators.

Outputs from sensors 42-45 are processed at a logic circuit as shown in FIG. 5 to actuate indicators 48-52.

Indicator 48 is for indicating a fact that box 46 is not correctly placed on handling table 17 for box returning operation so that box return is impossible. Indicator 49 is for indicating a fact that box 46 is brought out of the private room 3. Indicator 50 is for indicating a fact that a contractor steps out of the private room 3 leaving his box on handling table 17 without operating the storage command key 64. Indicator 51 is for indicating a fact that a contractor operates the storage command key 64 without taking his key from the lock of his box. Indicator 52 is for indicating a fact that the weight of the box is excessive.

These indicators 48-52 are disposed at the reception counter (14 in FIG. 1) to notice respective undesired facts to the reception clerk. These indicators 48-52 are alternatively disposed in another room such as an administering center.

Referring to FIG. 5, the logic circuit is composed of two inverters 53 and 54, six AND circuits 55–60, an OR circuit 61 and two flip-flop circuits 62 and 63.

The outputs of sensors 42–43, the retrieval command signal from the retrieval command key (which is shown at 65 in FIG. 4) of the console 18 and the storage command signal from the storage command key (which is shown at 64 in FIG. 4) of the console 18 are applied to the logic circuit.

The outputs of box sensor 42 and person sensor 44 are applied to invertors 53 and 54, respectively, and are phase-inverted thereat. The inverted signal from inverter 53 is applied to one input terminal of AND circuit 55. The other input terminal of the AND circuit 55 is coupled to the output of storage command key 64. The output of the AND circuit 55 is connected to the impossible box return indicator 48. Accordingly, if the box 46 is not correctly placed on handling table, an actuating signal is outputted from the AND circuit 55 at a time when storage command key 64 is operated. Therefore, the indicator is actuated to indicate that the box return operation is impossible.

The output of invertor 53 is also applied to one input terminal of another AND circuit 56, and the other input terminal of the AND circuit 56 is connected to the output of the other inverter 54. Therefore, when neither box sensor 42 nor person sensor 44 outputs a sensing signal, a signal is obtained at the output of the AND circuit 56. The signal represents a fact that neither box nor person is in the private room 3. The signal is applied to one input terminal of AND circuit 59. The other input terminal of the AND circuit 59 is connected to a set output Q of R-S flip-flop circuit 62. The retrieval command signal from retrieval command key 65 is applied to the flip-flop circuit 62 as a set input S through OR circuit 61, and the storage command signal from storage command key 64 is applied to the flip-flop circuit 62 as a reset input R. Therefore, during a time period from the retrieval command key operation to the storage command key operation, the output signal from AND circuit 56 passes AND circuit 59. The signal obtained from the AND circuit 59 represents that the box is brought out from the private room 3. The output of AND circuit 59 is connected to indicator 49. Therefore, indicator 49 is actuated by the output signal from AND circuit 59 to indicate that the box is brought out from private room 3.

In order to reset the flip-flop circuit 62 at a time when the set of the private code and the box code inputted at console 18 and reception data input terminal 16 does not coincide with any one of the combinations stored in ROM 23, another OR circuit 66 can be used. The storage command signal is applied to one input terminal of the OR circuit 66 and a discord signal from comparing and processing circuit 21 is applied to the other input terminal of the OR circuit 66. The output of the OR circuit 66 is coupled with a reset input terminal R of flip-flop circuit 62.

The inverted signal of inverter 54 is also applied to one input terminal of another AND circuit 57 with the other input terminal being connected to the output of box sensor 42. The output of the AND circuit 57 is connected to indicator 50. Accordingly, indicator 50 is actuated at a time when a sensing signal is provided from box sensor 42 while no sensing signal is obtained from person sensor 44. Therefore, the indicator 50 indicates that a person steps out of the private room 3 while leaving the box in the room 3.

Key sensor 45 is connected to an input terminal of AND circuit 60, and the set output Q of R-S flip-flop circuit 63 is connected to the other input terminal of the AND circuit 60. The storage command signal from storage command key 64 is applied to flip-flop circuit 63 as a set input. The output of the AND circuit 60 is connected to indicator 51. Accordingly, when key sensor 45 senses key 47 after the storage command key operation, indicator 51 is actuated to indicate that the box returning operation is initiated while the key 47 remains in the lock of the box.

A reset input signal can be applied to the flip-flop circuit 63 from a manual operation reset key (not shown).

Weight sensor 43 is connected to an input terminal of AND gate 58, and storage command key 64 is also connected to the other input terminal of the AND circuit 58. The output of the AND circuit 58 is applied to indicator 52. Therefore, if a sensing signal is provided from weight sensor 43 at a time when the storage command key 64 is operated, the indicator 52 is actuated to indicate that the weight of the box to be returned is excessive.

Therefore, undesired conditions in the private room can be monitored at a remote section.

Signals actuating respective indicators 48-52 can be used as a stop signal and are applied to the main control circuit 24. Then, main control circuit 24 controls to stop all devices belonging to the compartment where any undesired condition causing the stop signal happens.

Although the present invention has been described in connection with preferred embodiments, they are exemplary only. Various other designations and modifications can be easily made by those skilled in the art within the scope of the present invention.

What is claimed is:

1. In an automated system for storing and retrieving safety deposit boxes including a chamber provided with an opening and door means for sealing said opening, a storage unit disposed in said chamber having a plurality of storage locations arranged in matrix like form for receiving safety deposit boxes, a plurality of private compartments located outside of said chamber and motorized transport means for transporting said safety deposit boxes between said storage locations and said private compartments in a fully automated manner, an improved control system comprising in combination a reception data terminal located in an area remote from said private compartments and said chamber for receiving reception serial numbers and box codes corresponding to safety deposit boxes stored in said storage unit, a plurality of user's data terminals one of which is located in each of said private compartments for receiving said reception serial numbers, user's private codes, and storage and retrieval commands, and means for electrically controlling said transport means coupled to said reception data terminal and said plurality of user's data terminals including first memory means for permanently retaining the private codes and box codes of system users, second memory means for temporarily retaining said reception serial numbers and said box codes input to said reception data terminal, means for comparing (1) box codes stored in said first memory means with box codes input to said reception data terminal to produce the box codes as a preparatory signal when coincidence therebetween is detected, said comparing means further comparing (2) reception serial numbers retained in said second memory with reception serial numbers input to said user's terminals and (3) private codes retained in said first memory with private codes input to said user's terminals to produce a coincident signal upon detection of coincidence therebetween in the comparisons of (2) and (3), said control means allowing said transport means to carry out a preparatory operation for selective transfer of a preselected box to an intermediate storage area in said storage unit in response to said preparatory signal, said control means further allowing selective transfer of the preselected box from said storage unit to a predetermined private compartment in response to said coincident signal.

2. The control system according to claim 1, wherein said control means further includes means for initiating a transfer operation of a safety deposit box from said storage unit to a private compartment in response to receiving a reception serial number and a box code from said reception data terminal.

3. The control system according to claim 1, further comprising weight sensor means disposed in each of said private compartments for detecting the weight of a safety deposit box and means for indicating when the weight of said box exceeds a predetermined value as a storage command is input to a user's data terminal in said compartment.

4. The control system according to claim 3, wherein said weight indicating means includes means for carrying out a logical AND operation between a signal corresponding to a storage command and the output of said weight detecting means.

5. The control system according to claim 4, further comprising means for sensing the presence of a user disposed in each of said private rooms, a handling table in each of said private rooms, means for sensing the position of a safety deposit box associated with each of said handling tables to determine the position of a box placed thereon, and means adjacent each of said handling tables for determining the presence of a key in a safety deposit box.

* * * * *

UNITED STATES PATENT AND TRADEMARK OFFICE
CERTIFICATE OF CORRECTION

PATENT NO. : 4,792,270
DATED : December 20, 1988
INVENTOR(S) : Kakuo Yoshida

It is certified that error appears in the above—identified patent and that said Letters Patent is hereby corrected as shown below:

On the face page of the patent at [30] under the heading "Foreign Application Priority Date", the priority document identified as "56-42316" should read

-- 58-42316 -- .

Signed and Sealed this

Twenty-third Day of May, 1989

Attest:

DONALD J. QUIGG

Attesting Officer

Commissioner of Patents and Trademarks